United States Patent [19]

Poma et al.

[11] Patent Number: 5,309,347
[45] Date of Patent: May 3, 1994

[54] H-BRIDGE CIRCUIT WITH PROTECTION AGAINST CROSSOVER CONDUCTION

[75] Inventors: Alberto Poma, Pavia; Vanni Poletto, Casale Monferrato; Marco Morelli, Livorno, all of Italy

[73] Assignees: SGS-Thomson Microelectronics S.R.L., Agrate Brianza; Marelli Autronica S.p.A., Milan, both of Italy

[21] Appl. No.: 947,105

[22] Filed: Sep. 18, 1992

[30] Foreign Application Priority Data

Sep. 18, 1991 [IT] Italy .................... T091A000707

[51] Int. Cl.$^5$ .................................................. H02M 3/155
[52] U.S. Cl. ........................................ 363/63; 363/56
[58] Field of Search .................................. 363/56, 63

[56] References Cited

U.S. PATENT DOCUMENTS

| | | | |
|---|---|---|---|
| 3,538,353 | 11/1970 | Hanger | 307/255 |
| 3,778,641 | 12/1973 | Persson | 307/255 |
| 3,828,206 | 8/1974 | Zuk | 307/254 |
| 4,551,772 | 11/1985 | Sliger | 360/46 |
| 4,633,358 | 12/1986 | Nagano | 361/31 |
| 4,796,145 | 1/1989 | Oshikiri | 361/57 |
| 4,953,070 | 8/1990 | Lenz | 363/58 |
| 4,989,114 | 1/1991 | Storti et al. | 361/84 |

FOREIGN PATENT DOCUMENTS

| | | | |
|---|---|---|---|
| 0227411 | 7/1987 | European Pat. Off. | H03K 17/66 |
| 2340436 | 2/1975 | Fed. Rep. of Germany. | |
| 282383 | 12/1990 | German Democratic Rep. | H03K 17/66 |
| 58-107074 | 6/1983 | Japan | 363/63 |
| 84/03013 | 8/1984 | PCT Int'l Appl. | H03K 17/66 |
| 1462190 | 1/1977 | United Kingdom. | |

*Primary Examiner*—William H. Beha, Jr.
*Attorney, Agent, or Firm*—Robert Groover

[57] ABSTRACT

An H-bridge circuit which includes four power transistors (an npn pull-down and a pnp pull-up for each of the output terminals). Two control circuits are connected to drive these transistors in a complementary crossover configuration, so that each control circuit can turn on the pull-up transistor on one side of the load and the pull-down transistor on the opposite side of the load. Each of the power transistors is paralleled (base-to-base) by a smaller transistor which provides a scaled current output (proportional to that of the corresponding power transistor) to the opposite control circuit. The control circuit includes static current-thresholding disable logic, which prevents turn-on until the currents through the opposite power devices have declined to threshold levels. Thus, as long as either control circuit is driving one of the pull-up transistors into in the on-state, the other control circuit will not be able to turn on the pull-down transistor which is in series with the active pull-up transistor. This efficiently prevents any condition of unlimited crowbar current, without adding any excess delay or causing any high-impedance condition at the output.

35 Claims, 2 Drawing Sheets

H-BRIDGE CIRCUIT WITH PROTECTION AGAINST CROSSOVER CONDUCTION

BACKGROUND AND SUMMARY OF THE INVENTION

The present invention relates to H-shaped bridge circuit, and particularly to integrated circuits which include H-shaped bridge switching circuits.

H-shaped bridge circuits provide a convenient way to obtain a bipolar output from a unipolar power supply. Such circuits are very commonly used for DC motor control and other applications.[1]

[1] Some examples of published literature in this area include U.S. Pat. Nos. 5,111,381, "H-bridge flyback recirculator" (filed Aug. 12, 1991); 5,111,378, "DC chopper converter"; 5,079,924, "Circuit for controlling a free-piston engine in particular of a refrigerator compressor"; 4,988,931, "Motor driving device"; and 4,562,387, "Vehicle power window control"; all of which are hereby incorporated by reference.

An example of an H-shaped bridge circuit is shown in FIG. 1. The circuit shown has an input terminal In and two output terminals Out1 and Out2 between which a load L is connected. Four bipolar transistors Q1, Q2, Q3 and Q4, of which the first two are of the pnp type and the second two are of the npn type, are connected between the output terminals Out1 and Out2 and the two poles of a direct-current voltage supply Vs in the manner shown. In the embodiment illustrated, the negative pole of the supply is connected to ground.

The bases of the transistors Q1 and Q4 are connected to two outputs of a first control circuit C1, the input of which is connected to the input terminal In. The bases of the transistors Q2 and Q3 are connected to corresponding outputs of a second control circuit C2 which is structurally identical to C1 and the input of which is connected to the terminal In by means of an inverter INV.

In operation, when a level-"1" signal is applied to the input In, the control circuit C1 makes the power transistors Q1 and Q4 conductive and the control circuit C2 keeps the power transistors Q2 and Q3 cut off. In this situation, a current IL flows through the load L in the direction indicated by the arrow in FIG. 1.

When a level-"0" signal is applied to the input In, the control circuit C1 cuts off the power transistors Q1 and Q4 and the control circuit C2 makes the transistors Q1 and Q3 conductive. A current IL thus flows through the load L in the direction opposite that indicated by the arrow of FIG. 1.

In a bridge circuit of the type described above with reference to FIG. 1, it is of fundamental importance that current should not be conducted simultaneously in the two electronic power switches which are connected to the same output terminal. Should this occur, a very large current would be drawn from the supply with a serious risk of damage to the power switches, both as a result of the high intensity of the current passing through them and because of the related thermal effects.

Some bridge circuits have circuitry for slowing the reversal of the voltage (current) in the load. In these solutions, the problem of preventing an upper power switch and the adjacent lower power switch from conducting simultaneously is more complex since the conductive power switches remain conductive throughout the time taken by the voltage in the load to change from its initial value to its final value. In order to take account of the time taken by the transition of the voltage in the load, it is therefore necessary further to delay the change to the conductive condition of the power switch which was originally cut off.

A solution commonly used to prevent the simultaneous conduction of current in the two power switches which are connected to the same output terminal in upper and lower positions consists of the introduction of a delay between the switching-off of one switch and the switching-on of the other.

Since it is difficult to determine very precisely the duration of the delay, for safety, it has to be suitably oversized.

If the bridge circuit also has means for limiting the speed of the reversal of the voltage in the load, the delay has to be increased further to take account of the voltage-transition time and the related uncertainty with which that time is determined.

In any case, long delay times limit the maximum frequency at which the current in the load can be reversed. Moreover, in bridge circuits produced in the form of integrated circuits, there is a considerable increase in the area of silicon needed.

In bridge circuits in which, after switching, the current is recirculated by the same power switch which supplied the load before switching, the other power switch must be switched on only after the time taken by the recirculation has elapsed. Since the recirculation time depends on the characteristics of the load, the provision of a given delay limits the use of the bridge circuit in question to loads of certain types.

The present invention advantageously provides an H-shaped bridge circuit of the type specified above which, in a very reliable manner, prevents the simultaneous conduction (crossover conduction) of two electronic power switches connected to the same output terminal, without having the disadvantages of the prior art outlined above.

According to one class of embodiments of the invention, this object is achieved by an H-shaped bridge circuit in which the driver circuitry includes: at least one first and one second auxiliary electronic switch which are connected respectively to an electronic power switch of the first pair and to an electronic power switch of the second pair so that, in operation, the current flowing through each auxiliary electronic switch depends on the current flowing through the associated electronic power switch, and comparator and enabling circuitry connected to the auxiliary electronic switches for supplying a signal to enable current to be conducted through one of the pairs of electronic power switches only when the current flowing through the auxiliary switch associated with the other pair has fallen below a predetermined value.

Preferably, according to a further class of embodiments, the driver circuit means include two pairs of auxiliary electronic switches, each of which is connected to an associated electronic power switch so that, in operation, the current flowing through each auxiliary switch is a fraction of the current flowing through the associated power switch. In this case, the comparator and enabling circuitry is arranged to supply the signal for enabling current to be conducted through one of the pairs of power switches only when the currents flowing through both the auxiliary switches associated with the other pair of power switches have fallen below predetermined values.

According to at least some embodiments of the present invention, there is provided an H-bridge amplifier circuit, comprising: first and second output terminals; a first pull-down power transistor connected between said first output terminal and a first power supply connection, and a first pull-up power transistor connected between said first output terminal and a second power supply connection which is more positive than said first power supply connection; and a second pull-down power transistor connected between said second output terminal and said first power supply connection, and a second pull-up power transistor connected between said second output terminal and said second power supply connection; and a first control circuit connected to control said first pull-up power transistor and said second pull-down power transistor, and a second control circuit connected to control said second pull-up power transistor and said first pull-down power transistor; said first and second control circuits each having at least one respective enable/disable input; a first auxiliary pull-down transistor connected, in parallel with said first power pull-down transistor, to provide said first control circuit with a respective monitoring current which is proportional to the current output of said first pull-down transistor; and a first auxiliary pull-up transistor connected, in parallel with said first power pull-up transistor, to provide said second control circuit with a respective monitoring current which is proportional to the current output of said first pull-down transistor; and a second auxiliary pull-up transistor connected, in parallel with said second power pull-up transistor, to provide said first control circuit with a respective monitoring current which is proportional to the current output of said first pull-down transistor; and a second auxiliary pull-down transistor connected, in parallel with said second power pull-down transistor, to provide said second control circuit with a respective monitoring current which is proportional to the current output of said first pull-down transistor; wherein said first and second control circuit each contain current-thresholding disable logic connected to receive at least two said monitoring currents from at least one of said auxiliary transistors, and to disable activation of power transistors by said control circuit if either said monitoring current is greater than a predetermined respective magnitude.

According to at least some embodiments of the present invention, there is provided an integrated circuit H-bridge amplifier, comprising: first and second output terminals; a first pull-down power transistor connected between said first output terminal and a first power supply connection, and a first pull-up power transistor connected between said first output terminal and a second power supply connection which is more positive than said first power supply connection; and a second pull-down power transistor connected between said second output terminal and said first power supply connection, and a second pull-up power transistor connected between said second output terminal and said second power supply connection; and a first control circuit connected to control said first pull-up power transistor and said second pull-down power transistor, and a second control circuit connected to control said second pull-up power transistor and said first pull-down power transistor; said first and second control circuits each having at least one respective enable/disable input; at least two different transistors selected from the group consisting of: 1) a first auxiliary pull-down transistor connected, in parallel with said first power pull-down transistor, to provide said first control circuit with a monitoring current which is proportional to and smaller than the current output of said first pull-down transistor; and 2) a first auxiliary pull-up transistor connected, in parallel with said first power pull-up transistor, to provide said second control circuit with a monitoring current which is proportional to and smaller than the current output of said first pull-down transistor; and 3) a second auxiliary pull-up transistor connected, in parallel with said second power pull-up transistor, to provide said first control circuit with a monitoring current which is proportional to and smaller than the current output of said first pull-down transistor; and 4) a second auxiliary pull-down transistor connected, in parallel with said second power pull-down transistor, to provide said second control circuit with a monitoring current which is proportional to and smaller than the current output of said first pull-down transistor; wherein said first and second control circuit each contain current-thresholding disable logic connected to receive at least one said monitoring current from at least one of said auxiliary transistors, and to disable activation of power transistors by said control circuit if said monitoring current is greater than a predetermined respective magnitude.

According to at least some embodiments of the present invention, there is provided an integrated circuit H-bridge amplifier, comprising: first and second output terminals; a first pull-down power device connected between said first output terminal and a first power supply connection, and a first pull-up power device connected between said first output terminal and a second power supply connection which is more positive than said first power supply connection; and a second pull-down power device connected between said second output terminal and said first power supply connection, and a second pull-up power device connected between said second output terminal and said second power supply connection; and a first control circuit connected to control said first pull-up power device and said second pull-down power device, and a second control circuit connected to control said second pull-up power device and said first pull-down power device; said first and second control circuits each having at least one respective enable/disable input; at least two different devices selected from the group consisting of: 1) a first auxiliary pull-down device connected to said first power supply connection and connected to be controlled by said second control circuit in parallel with said first power pull-down device and connected to supply an enable signal to said first control circuit accordingly; and 2) a first auxiliary pull-up device connected to said second power supply connection and connected to be controlled by said first control circuit in parallel with said first power pull-up device and connected to supply an enable signal to said second control circuit accordingly; and 3) a second auxiliary pull-up device connected to said second power supply connection and connected to be controlled by said second control circuit in parallel with said second power pull-up device and connected to supply an enable signal to said first control circuit accordingly; and 4) a second auxiliary pull-down device connected to said first power supply connection and connected to be controlled by said first control circuit in parallel with said second power pull-down device and connected to supply an enable signal to said second control circuit accordingly.

According to at least some embodiments of the present invention, there is provided an integrated circuit H-bridge amplifier, comprising: first and second output terminals; a first pull-down power transistor connected between said first output terminal and a first power supply connection, and a first pull-up power transistor connected between said first output terminal and a second power supply connection which is more positive than said first power supply connection; and a second pull-down power transistor connected between said second output terminal and said first power supply connection, and a second pull-up power transistor connected between said second output terminal and said second power supply connection; and a first control circuit connected to control said first pull-up power transistor and said second pull-down power transistor, and a second control circuit connected to control said second pull-up power transistor and said first pull-down power transistor; said first and second control circuits each having at least one respective enable/disable input; at least two different transistors selected from the group consisting of: 1) a first auxiliary pull-down transistor connected to said first power supply connection and connected to be controlled by said second control circuit in parallel with said first power pull-down transistor and connected to supply an enable signal to said first control circuit accordingly; and 2) a first auxiliary pull-up transistor connected to said second power supply connection and connected to be controlled by said first control circuit in parallel with said first power pull-up transistor and connected to supply an enable signal to said second control circuit accordingly; and 3) a second auxiliary pull-up transistor connected to said second power supply connection and connected to be controlled by said second control circuit in parallel with said second power pull-up transistor and connected to supply an enable signal to said first control circuit accordingly; and 4) a second auxiliary pull-down transistor connected to said first power supply connection and connected to be controlled by said first control circuit in parallel with said second power pull-down transistor and connected to supply an enable signal to said second control circuit accordingly.

According to at least some embodiments of the present invention, there is provided a method for operating an H-bridge switching circuit in accordance with a digital input signal, comprising the steps of: when said digital input signal is in a first state: turning on a first pull-down power transistor, which is connected to drive said first output terminal low, and turning off a first pull-up power transistor which is connected to drive said first output terminal high when turned on, and turning on a second pull-up power transistor which is connected to drive said second output terminal high, and turning off a second pull-down power transistor which is connected to drive said first output terminal low when turned on; when said digital input signal is in a second state opposite to said first state: turning off said first pull-down transistor, and turning on said first pull-up power transistor, and turning off said second pull-up transistor, and turning on said second pull-down transistor; monitoring the current passed by said first pull-up power device, and blocking said step (a.i.) whenever the instantaneous value of the current passed by said first pull-up power device is greater than a predetermined quantity; and monitoring the current passed by said second pull-up power device, and preventing said step (b.iv) whenever the instantaneous value of the current passed by said second pull-up power device is greater than a predetermined quantity.

According to at least some embodiments of the present invention, there is provided a method for operating an H-bridge switching circuit in accordance with a digital input signal, comprising the steps of: when said digital input signal is in a first state: turning on a first pull-down power transistor, which is connected to drive said first output terminal low, and turning off a first pull-up power transistor which is connected to drive said first output terminal high when turned on, and turning on a second pull-up power transistor which is connected to drive said second output terminal high, and turning off a second pull-down power transistor which is connected to drive said first output terminal low when turned on; when said digital input signal is in a second state opposite to said first state: turning off said first pull-down transistor, and turning on said first pull-up power transistor, and turning off said second pull-up transistor, and turning on said second pull-down transistor; monitoring the current passed by said first pull-up power device, and blocking said step (a.i.) whenever the instantaneous value of the current passed by said first pull-up power device is greater than a predetermined quantity; and monitoring the current passed by said second pull-up power device, and preventing said step (b.iv) whenever the instantaneous value of the current passed by said second pull-up power device is greater than a predetermined quantity; monitoring the current passed by said first pull-down power device, and preventing said step (b.ii.) of turning on said first pull-up power transistor whenever the instantaneous value of the current passed by said first pull-down power device is greater than a predetermined quantity; and monitoring the current passed by said second pull-down power device, and preventing said step (a.iii.) of turning on said second pull-up power transistor whenever the instantaneous value of the current passed by said second pull-down power device is greater than a predetermined quantity.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
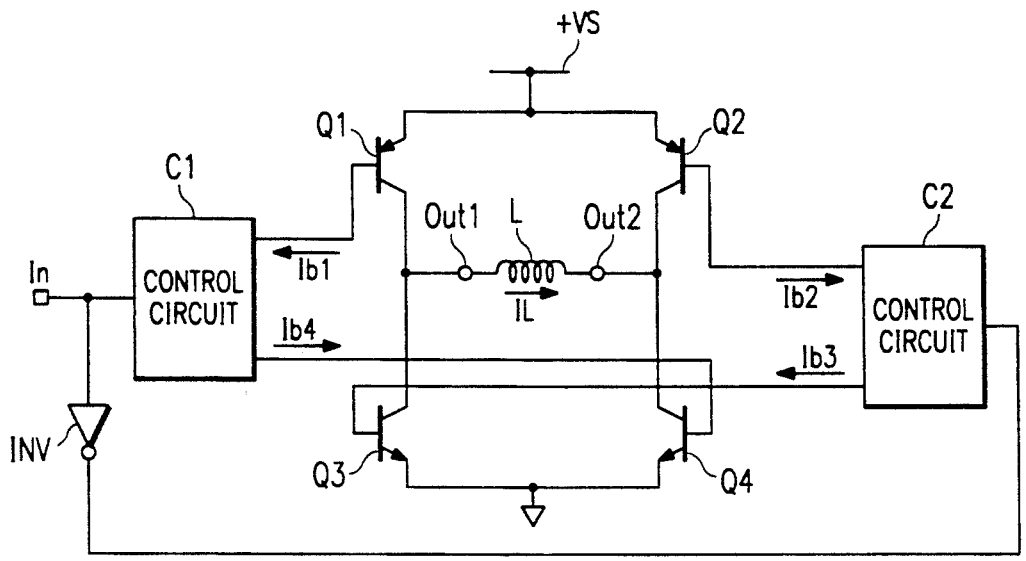
FIG. 1, which has already been described, shows an H-shaped bridge circuit of the prior art.
Figure 2:
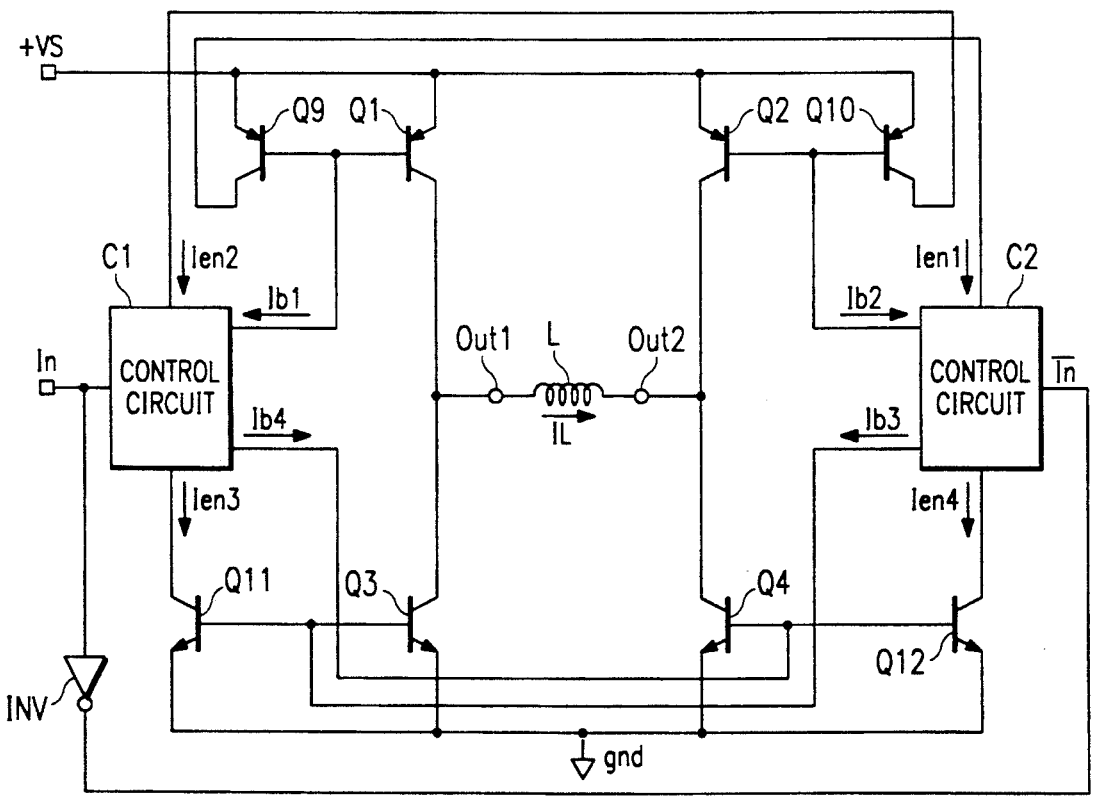
FIG. 2 is a circuit diagram of an H-shaped bridge circuit according to the presently preferred embodiment.

In FIG. 2, parts and elements already described with reference to FIG. 1 have again been indicated by the same alphanumeric reference symbols.

In the circuit according to the invention shown in FIG. 2, respective auxiliary transistors, indicated Q9–Q12, are associated with the power transistors Q1–Q4. In particular, the transistors Q9 and Q10 are pnp transistors as are the respective power transistors Q1 and Q2 with which they are associated, and the transistors Q11 and Q12 are npn transistors as are the corresponding power transistors Q3 and Q4.

The base and the emitter of each of the auxiliary transistors Q10–Q11 are connected respectively to the base and the emitter of the corresponding power transistor Q1–Q4.

The collectors of the auxiliary transistors Q10 and Q11 are connected to corresponding inputs of the control circuit C1 which drives the bases of the power transistors Q1 and Q4 and the bases of the associated auxiliary transistors Q10 and Q11.

The collectors of the auxiliary transistors Q10 and Q11 are connected to corresponding inputs of the second control circuit C2 which drives the bases of the power transistors Q2 and Q3 and the bases of the associated auxiliary transistors Q9 and Q12.

In FIG. 2, the currents for driving the bases of the power transistors Q1–Q4 and the associated auxiliary transistors Q9–Q12 are indicated Ib1, Ib2, Ib3 and Ib4.

The collector currents in the four auxiliary transistors Q9–Q12 are indicated Ien1–Ien4.

Figure 3:
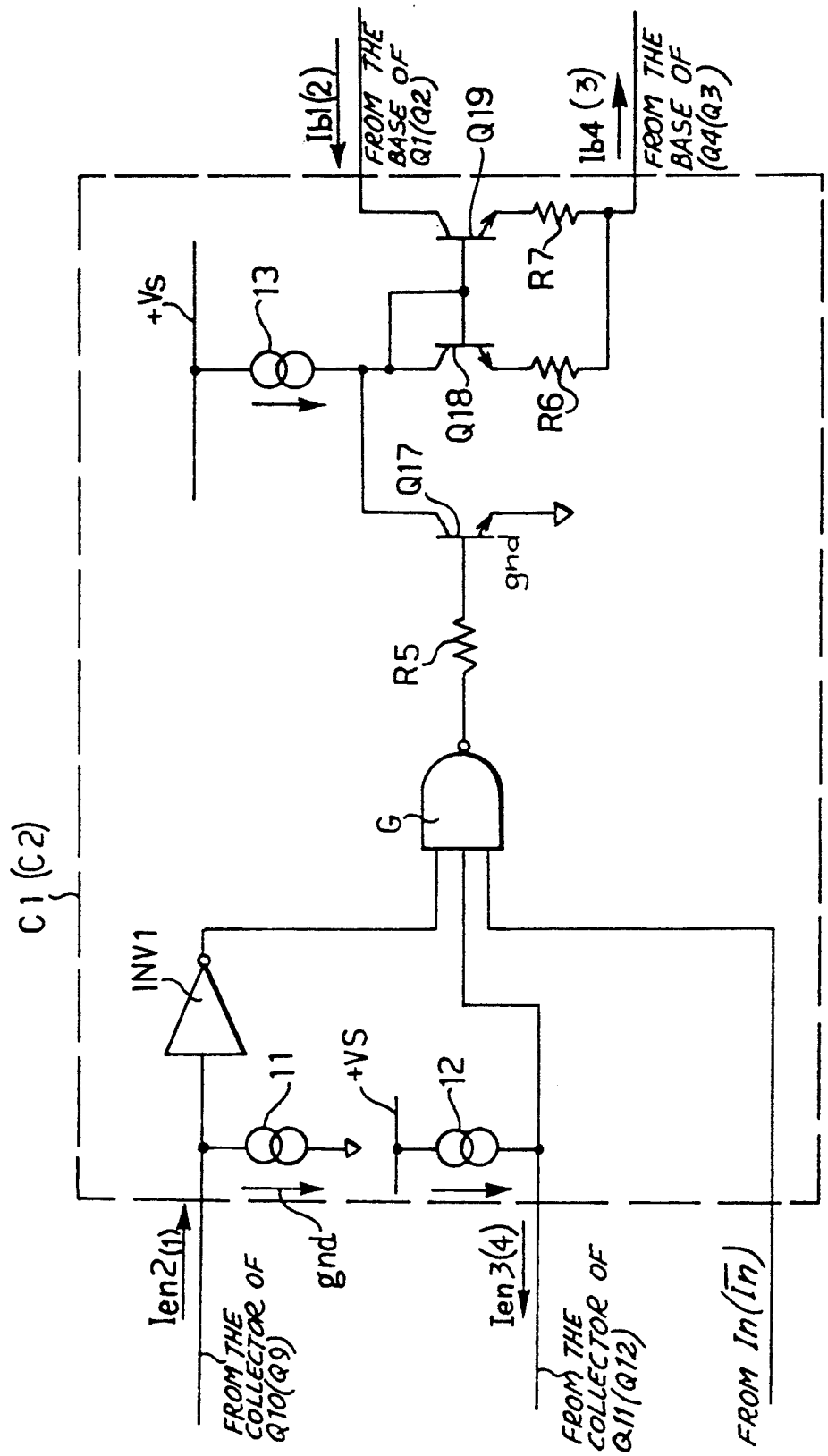
FIG. 3 is a circuit diagram of one embodiment of two circuits which are included in the bridge circuit of FIG. 2, in the presently preferred embodiment, for controlling the switching.

The control circuits C1 and C2 have identical internal structures, for example, the structure shown in FIG. 3, which will now be described with reference to the circuit C1. In FIG. 3, the alphanumeric reference symbols given in brackets apply to the control circuit C2.

With reference to FIG. 3, therefore, the control circuit C1 includes a first current generator I1 between the collector of Q10 and ground. In the embodiment illustrated, the generator I1 generates a current which is directed towards ground. The collector of Q10 is also connected to an inverter INV1, the output of which is connected to a first input of a NAND logic gate G.

A second current generator I2 is connected between the positive pole of the voltage supply Vs and the collector of Q11. The latter is also connected to a second input of the logic gate G. A third input of this gate is also connected to the input terminal In.

The output of the logic gate G is connected to the base of an npn transistor Q17 by means of a resistor R5. The emitter of the transistor Q17 is connected to ground and its collector is connected to that of an npn transistor indicated Q18. A current generator I3 is connected between the supply Vs and the collector of Q18. The base of the transistor 18 is connected to its own collector and to the base of a further npn transistor, indicated Q19.

The emitter of Q18 is connected to the base of Q4 by means of a resistor R6.

The collector of the transistor Q9 is connected to the base of Q1 and its emitter is connected to the base of Q4 by means of a resistor R7.

The bridge circuit described above with reference to FIGS. 2 and 3 can conveniently be produced in the form of a monolithic integrated circuit on a single substrate of semiconductor material, particularly silicon, and operates in the following manner.

When a level-"1" signal is applied to the input In, the control circuit C1 absorbs a current Ib1 and generates a current Ib4 such as to keep the power transistors Q1 and Q4 saturated. The control circuit C2 keeps the power transistors Q2 and Q3 switched off, that is, cut off.

In this situation, since the base-emitter voltages of Q1 and Q9 are the same, the collector current, indicated Ien1, of Q9 is n times smaller than IL, where n=A(Q1)/A(Q9) and where A(Q1) is much greater than A(Q9), A(Q1) and A(Q9) being the areas of silicon of the emitters of the transistors Q1 and Q9, respectively.

Similarly, Ien4=IL/m, where m=A(Q4)/A(Q12) and A(Q4) is much greater than A(Q12).

In order to reverse the direction of the current IL in the load L, a level-"0" logic signal is applied to the input In. The output of the logic gate G of the control circuit C1 thus immediately goes to the level "1"; the transistor Q17 becomes conductive and the transistor Q19 is cut off. The currents Ib1 and Ib4 thus cease. The appearance of a level-"0" signal at the input In does not, however, cause the power transistors Q2 and Q3 to become conductive immediately. In fact (see FIG. 3), in this case, a level-"1" signal is applied to the input In of the control circuit C2 but the signals at the other inputs of that gate remain at the level "0" until the currents Ien1 and Ien4 fall below the currents generated by the generators I1 and I2. The currents produced by these generators thus represent the minimum current thresholds below which the output currents of the auxiliary transistors Q9 and Q12 (which currents, as has been seen, represent fractions of the output currents of the power transistors Q1 and Q4) must fall in order for the output of the logic gate G of the control circuit C2 to cut off the transistor Q17 of that control circuit and thus cause its transistor Q19, and hence the power transistors Q2 and Q3, to become conductive.

In view of the perfect symmetry of the bridge circuit and of the control circuits C1 and C2, the foregoing description relating to the stage in which Q2 and Q3 are made conductive after Q1 and Q4 have been cut off applies in a similar manner to the stage in which the transistors Q2 and Q3 are cut off and the transistors Q1 and Q4 become conductive again.

Although, in the embodiment described above, auxiliary transistors are associated with all four power transistors Q1–Q4, clearly the use of auxiliary transistors could be limited to two (for example Q9 and Q10) associated with two power transistors which are intended to be switched on and off in opposition.

The solution shown, which has four auxiliary transistors, prevents any problems resulting from the difference between the times taken by pnp and npn transistors to switch off.

With few components, and hence with the use of a moderate area of silicon, the bridge circuit according to the invention provides effective protection against simultaneous conduction in the two electronic power switches connected to the same output terminal.

The solution described prevents any problems relating to the creation of delay times which, in the prior-art circuit, have to be long and precise.

The circuit according to the invention also has greater flexibility of usage since it can operate even when the switching-off times of the power transistors are different.

The fact that a power transistor cannot be switched on until the power transistor connected to the same output terminal has been switched off prevents peaks in the current drawn from the battery during switching which could, however, occur if, for example, the switching-on of one power transistor were to cause the switching-off of the other.

The fact that one power transistor is switched on as soon as the other power transistor connected to the same output terminal is switched off enables the load always to be driven with a low impedance (there is no situation in which both the power transistors are switched off). This is advantageous if, in suitable circuits, the output voltage is used for monitoring the operation of the system.

The use of the proposed solution in a bridge circuit in which the speed of the reversal of the voltage in the load is limited is particularly advantageous as regards the minimizing of the number of components used, since it is free of delay times in the switching-on of the power switches. Since, in some cases, the voltage in the load intentionally takes a long time to change, the provision of a delay to take account of the uncertainty in determining this time might otherwise be too difficult, particularly in the case of integrated circuits.

Another application in which the solution according to the invention is very advantageous is when the bridge circuit drives an inductive load and the power switches which supply the load before switching are also used for recirculating the current after switching.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, although the presently preferred embodiment is implemented with complementary bipolar devices, alternatively other device technologies (such as BiCMOS, CMOS, or even SCR devices) could be used instead.

Moreover, the disclosed innovative teachings can also, alternatively and less preferably, be adapted to implementation using discrete power devices.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An H-bridge amplifier circuit, comprising:
   first and second output terminals;
   a first pull-down power transistor connected between said first output terminal and a first power supply connection, and a first pull-up power transistor connected between said first output terminal and a second power supply connection which is more positive than said first power supply connection; and a second pull-down power transistor connected between said second output terminal and said first power supply connection, and a second pull-up power transistor connected between said second output terminal and said second power supply connection; and
   a first control circuit connected to control said first pull-up power transistor and said second pull-down power transistor, and a second control circuit connected to control said second pull-up power transistor and said first pull-down power transistor; said first and second control circuits each having at least one respective enable/disable input;
   a first auxiliary pull-down transistor connected, in parallel with said first power pull-down transistor, to provide said first control circuit with a respective monitoring current which is proportional to the current output of said first pull-down transistor; and
   a first auxiliary pull-up transistor connected, in parallel with said first power pull-up transistor, to provide said second control circuit with a respective monitoring current which is proportional to the current output of said first pull-down transistor; and
   a second auxiliary pull-up transistor connected, in parallel with said second power pull-up transistor, to provide said first control circuit with a respective monitoring current which is proportional to the current output of said first pull-down transistor; and
   a second auxiliary pull-down transistor connected, in parallel with said second power pull-down transistor, to provide said second control circuit with a respective monitoring current which is proportional to the current output of said first pull-down transistor;
   wherein said first and second control circuit each contain current-thresholding disable logic connected to receive at least two said monitoring currents from at least one of said auxiliary transistors, and to disable activation of power transistors by said control circuit if either said monitoring current is greater than a predetermined respective magnitude.

2. The circuit of claim 1, wherein each of said transistors is a bipolar transistor.

3. The circuit of claim 1, wherein each of said pull-up transistors is a pnp bipolar transistor, and each of said pull-down transistors is an npn bipolar transistor.

4. The circuit of claim 1, wherein each of said pull-up power devices is much larger than any of said auxiliary pull-up devices, and each of said pull-down power devices is much larger than any of said auxiliary pull-down devices.

5. The circuit of claim 1, wherein each of said control circuits further comprises an input for a logical enable signal.

6. A circuit, comprising:
   first and second output terminals for connection to the terminals of a load,
   first and second pairs of electronic power switches which are connected between said output terminals and the two poles of a direct-current voltage supply so as to form an H-shaped structure with the load, and driver circuit connected to selectively make said the electronic power switches of said first pair or of said second pair conductive in order to cause a current to flow through the load in one direction or the other, respectively, and for preventing said electronic power switches which are connected between the same output terminal and the two poles of the voltage supply from conducting simultaneously; said driver circuit also including:

at least one first and one second auxiliary electronic switch, which are connected respectively to an electronic power switch of said first pair and to an electronic power switch of said second pair in a relation such that, in operation, the current flowing through each auxiliary electronic switch depends on the current flowing through the associated electronic power switch; and wherein comparator and enabling circuitry are connected to said auxiliary electronic switches for supplying a signal to enable current to be conducted through one of said pairs of electronic power switches only when the current flowing through said auxiliary switch associated with the other pair has fallen below a predetermined value.

7. A circuit according to claim 6, wherein each auxiliary electronic switch is associated with a power switch which is connected between an output terminal and the same pole of said voltage supply.

8. A circuit according to claim 6, wherein said driver circuit includes two pairs of auxiliary electronic switches, each auxiliary switch being connected to an associated electronic power switch so that, in operation, the current flowing through each auxiliary switch depends on the current flowing through the associated power switch, and in that said comparator and enabling circuitry is arranged to supply a signal for enabling current to be conducted through one of said pairs of power switches only when the currents flowing in both said auxiliary switches associated with the other pair of power switches have fallen below predetermined values.

9. A circuit according to claim 6, wherein the auxiliary electronic switches are connected to said associated electronic power switches in a manner such that the current flowing through each auxiliary switch is a fraction of that flowing through the associated electronic power switch.

10. A circuit according to claim 6, formed as a monolithic integrated circuit on a single substrate of semiconductor material, wherein said electronic power switches and said auxiliary electronic switches are transistors, the area of semiconductor material occupied by each auxiliary switch being a fraction of the area occupied by said associated electronic power switch.

11. A circuit according to claim 6, wherein said electronic power switches and said auxiliary electronic switches are bipolar transistors, the base and the emitter of each auxiliary transistor being connected respectively to the base and to the emitter of the associated power transistor, its collector being connected to said driver circuit.

12. A circuit according to claim 6, wherein said comparator and enabling circuitry includes first and second control circuits which are associated with said first pair and with said second pair of electronic power switches, respectively, and each of which has:

a drive input for receiving a two-state signal for controlling the switching, a circuit for controlling conduction, having two outputs connected to said control terminals of said associated pair of electronic power switches, at least one comparator circuit connected to said auxiliary switch associated with said other pair of electronic power switches, and an enabling logic circuit having its output connected to said input of said conduction-controlling circuit and at least a first input connected to said drive input and a second input connected to said output of said comparator circuit.

13. A circuit according to claim 8, wherein said comparator and enabling circuitry also includes a second comparator circuit, said input of which is connected to said other auxiliary electronic switch associated with said other pair of electronic power switches and said output of which is connected to a further input of said enabling logic circuit.

14. A circuit according to claim 12, wherein said enabling circuit is NAND type.

15. A circuit according to claim 12, wherein said comparator and enabling circuitry also includes a second comparator circuit, the input of which is connected to the other auxiliary electronic switch associated with the other pair of electronic power switches and the output of which is connected to a further input of the enabling logic circuit.

16. A circuit according to claim 13, wherein said enabling circuit is NAND type.

17. An integrated circuit H-bridge amplifier, comprising:

first and second output terminals;

a first pull-down power transistor connected between said first output terminal and a first power supply connection, and a first pull-up power transistor connected between said first output terminal and a second power supply connection which is more positive than said first power supply connection; and a second pull-down power transistor connected between said second output terminal and said first power supply connection, and a second pull-up power transistor connected between said second output terminal and said second power supply connection; and a first control circuit connected to control said first pull-up power transistor and said second pull-down power transistor, and a second control circuit connected to control said second pull-up power transistor and said first pull-down power transistor; said first and second control circuits each having at least one respective enable/disable input;

at least two different transistors selected from the group consisting of:

1) a first auxiliary pull-down transistor connected, in parallel with said first power pull-down transistor, to provide said first control circuit with a monitoring current which is proportional to and smaller than the current output of said first pull-down transistor; and 2) a first auxiliary pull-up transistor connected, in parallel with said first power pull-up transistor, to provide said second control circuit with a monitoring current which is proportional to and smaller than the current output of said first pull-down transistor; and 3) a second auxiliary pull-up transistor connected, in parallel with said second power pull-up transistor, to provide said first control circuit with a monitoring current which is proportional to and smaller than the current output of said first pull-down transistor; and 4) a second auxiliary pull-down transistor connected, in parallel with said second power pull-down transistor, to provide said second control circuit with a monitoring current which is proportional to and smaller than the current output of said first pull-down transistor;

wherein said first and second control circuit each contain current-thresholding disable logic connected to receive at least one said monitoring current from at least one of said auxiliary transistors, and to disable activation of power transistors by said control circuit if said monitoring current is greater than a predetermined respective magnitude.

18. The integrated circuit of claim 17, wherein each of said transistors is a bipolar transistor.

19. The integrated circuit of claim 17, wherein each of said pull-up transistors is a pnp bipolar transistor, and each of said pull-down transistors is an npn bipolar transistor.

20. The integrated circuit of claim 17, comprising at least one of said first auxiliary pull-up transistors, at least one of said second auxiliary pull-up transistors, at least one of said first auxiliary pull-down transistors, and at least one of said second auxiliary pull-down transistors.

21. The integrated circuit of claim 17, wherein each of said pull-up power transistors is much larger than any of said auxiliary pull-up transistors, and each of said pull-down power transistors is much larger than any of said auxiliary pull-down transistors.

22. The integrated circuit of claim 17, wherein each of said control circuits further comprises an input for a logical enable signal.

23. An integrated circuit H-bridge amplifier, comprising:

first and second output terminals;

a first pull-down power device connected between said first output terminal and a first power supply connection, and a first pull-up power device connected between said first output terminal and a second power supply connection which is more positive than said first power supply connection; and a second pull-down power device connected between said second output terminal and said first power supply connection, and a second pull-up power device connected between said second output terminal and said second power supply connection; and a first control circuit connected to control said first pull-up power device and said second pull-down power device, and a second control circuit connected to control said second pull-up power device and said first pull-down power device; said first and second control circuits each having at least one respective enable/disable input;

at least two different devices selected from the group consisting of:

1) a first auxiliary pull-down device connected to said first power supply connection and connected to be controlled by said second control circuit in parallel with said first power pull-down device and connected to supply an enable signal to said first control circuit accordingly; and 2) a first auxiliary pull-up device connected to said second power supply connection and connected to be controlled by said first control circuit in parallel with said first power pull-up device and connected to supply an enable signal to said second control circuit accordingly; and 3) a second auxiliary pull-up device connected to said second power supply connection and connected to be controlled by said second control circuit in parallel with said second power pull-up device and connected to supply an enable signal to said first control circuit accordingly; and 4) a second auxiliary pull-down device connected to said first power supply connection and connected to be controlled by said first control circuit in parallel with said second power pull-down device and connected to supply an enable signal to said second control circuit accordingly.

24. The integrated circuit of claim 23, wherein each of said devices is a bipolar transistor.

25. The integrated circuit of claim 23, wherein each of said devices is a transistor.

26. The integrated circuit of claim 23, wherein each of said pull-up devices is a pnp bipolar transistor, and each of said pull-down devices is an npn bipolar transistor.

27. The integrated circuit of claim 23, wherein each of said pull-up devices is a pnp bipolar transistor, and each of said pull-down devices is an npn bipolar transistor; and wherein each of said said pull-up power devices is much larger than any of said auxiliary pull-up devices.

28. The integrated circuit of claim 23, comprising at least one of said first auxiliary pull-up devices, at least one of said second auxiliary pull-up devices, at least one of said first auxiliary pull-down devices, and at least one of said second auxiliary pull-down devices.

29. The integrated circuit of claim 23, wherein each of said control circuits further comprises an input for a logical enable signal.

30. An integrated circuit H-bridge amplifier, comprising:

first and second output terminals;

a first pull-down power transistor connected between said first output terminal and a first power supply connection, and a first pull-up power transistor connected between said first output terminal and a second power supply connection which is more positive than said first power supply connection; and a second pull-down power transistor connected between said second output terminal and said first power supply connection, and a second pull-up power transistor connected between said second output terminal and said second power supply connection; and a first control circuit connected to control said first pull-up power transistor and said second pull-down power transistor, and a second control circuit connected to control said second pull-up power transistor and said first pull-down power transistor; said first and second control circuits each having at least one respective enable/disable input;

at least two different transistors selected from the group consisting of:

1) a first auxiliary pull-down transistor connected to said first power supply connection and connected to be controlled by said second control circuit in parallel with said first power pull-down transistor and connected to supply an enable signal to said first control circuit accordingly; and 2) a first auxiliary pull-up transistor connected to said second power supply connection and connected to be controlled by said first control circuit in parallel with said first power pull-up transistor and connected to supply an enable signal to said second control circuit accordingly; and 3) a second auxiliary pull-up transistor connected to said second power supply connection and connected to be controlled by said second control circuit in parallel with said second power pull-up transistor and connected to supply an enable signal to said first control circuit accordingly; and 4) a second auxiliary pull-down transistor connected to said first power supply connection and connected to be controlled by said first control circuit in parallel with said second power pull-down transistor and connected to supply an enable signal to said second control circuit accordingly.

31. The integrated circuit of claim 30, wherein each of said pull-up transistors is a pnp bipolar transistor, and each of said pull-down transistors is an npn bipolar transistor.

32. The integrated circuit of claim 30, wherein each of said transistors is a bipolar transistor.

33. The integrated circuit of claim 30, wherein each of said pull-up power transistors is much larger than any of said auxiliary pull-up transistors, and each of said pull-down power transistors is much larger than any of said auxiliary pull-down transistors.

34. The integrated circuit of claim 30, comprising at least one of said first auxiliary pull-up transistors, at least one of said second auxiliary pull-up transistors, at least one of said first auxiliary pull-down transistors, and at least one of said second auxiliary pull-down transistors.

35. The integrated circuit of claim 30, wherein each of said control circuits further comprises an input for a logical enable signal.

* * * * *